(12) United States Patent
Tracht et al.

(10) Patent No.: US 7,570,004 B2
(45) Date of Patent: Aug. 4, 2009

(54) SYSTEM AND METHOD FOR DETECTING A MOTOR SHORTING RELAY FAILURE

(75) Inventors: Steven L. Tracht, Howell, MI (US); Yulei Chen, Northville, MI (US)

(73) Assignee: Delphi Technologies Inc., Troy, MI (US)

( * ) Notice: Subject to any disclaimer, the term of this patent is extended or adjusted under 35 U.S.C. 154(b) by 374 days.

(21) Appl. No.: 11/591,270

(22) Filed: Oct. 31, 2006

(65) Prior Publication Data

US 2008/0100332 A1 May 1, 2008

(51) Int. Cl.
*G01R 31/02* (2006.01)
(52) U.S. Cl. .................. 318/490; 318/299; 318/515; 318/516; 318/790; 324/418; 324/500; 324/772
(58) Field of Classification Search ............... 318/299, 318/489, 490, 500, 507, 514, 515, 516, 528, 318/772, 790, 644; 324/772, 418
See application file for complete search history.

(56) References Cited

U.S. PATENT DOCUMENTS

| | | | | |
|---|---|---|---|---|
| 3,947,764 A * | 3/1976 | Abbott et al. | ................ | 324/772 |
| 4,177,419 A * | 12/1979 | Fiorentzis | .................... | 324/418 |
| 4,352,137 A * | 9/1982 | Johns | ........................ | 361/82 |
| 4,634,981 A * | 1/1987 | Shimp et al. | ................. | 324/424 |
| 5,363,039 A * | 11/1994 | Kumar et al. | ............. | 324/158.1 |
| 5,444,377 A * | 8/1995 | Del Vecchio et al. | ........ | 324/424 |
| 5,576,625 A * | 11/1996 | Sukegawa et al. | ........... | 324/424 |
| 6,366,434 B2 * | 4/2002 | Magnussen | ................... | 361/55 |
| 6,396,279 B1 * | 5/2002 | Gruenert | ..................... | 324/424 |
| 6,426,632 B1 * | 7/2002 | Clunn | ........................ | 324/509 |
| 6,671,142 B2 * | 12/2003 | Beckert et al. | .................. | 361/2 |
| 6,930,490 B2 * | 8/2005 | Saunders et al. | ............. | 324/511 |
| 7,180,297 B2 * | 2/2007 | Deak et al. | ................... | 324/418 |
| 7,415,377 B2 * | 8/2008 | Klijn et al. | ................... | 702/115 |

* cited by examiner

*Primary Examiner*—Bentsu Ro
*Assistant Examiner*—Antony M Paul
(74) *Attorney, Agent, or Firm*—Thomas N. Twomey

(57) ABSTRACT

Methods and systems for detecting a motor shorting relay failure. Exemplary embodiments include methods and systems for determining a motor shorting relay failure in a motor, the motor having first phase winding in a first leg of the motor, a second phase winding in a second leg of the motor, and a third phase winding in a third leg of the motor, the method including applying a first voltage signal to the first leg, applying a second voltage signal to the second leg, applying a test voltage to a test circuit electrically coupled to the third leg, measuring a third voltage signal in the third leg at a first predetermined time in response to the application of the first and second voltage signals and determining a motor shorting relay in the motor, based on the amplitude of the third voltage signal.

17 Claims, 8 Drawing Sheets

SYSTEM AND METHOD FOR DETECTING A MOTOR SHORTING RELAY FAILURE

BACKGROUND

This invention relates generally to vehicle steering devices, and more particularly, to a system and a method for detecting a motor shorting relay failure.

The term "active steering" relates to a vehicular control system, which generates an output that is added to or subtracted from the front steering angle, wherein the output is typically responsive to the yaw and/or lateral acceleration of the vehicle. Active front control steering may improve vehicle-handling stability on a variety of road conditions. Stability control may be continuously active. For higher vehicle speeds, vehicle sensitivity of steering may be smaller. At lower vehicle speeds, park solution sensitivity may be increased and driver workload reduced. Thus, in some situations, an active steering control system may react more quickly and accurately than an average driver to correct transient handling instabilities. In addition, active steering can also provide for variable steering ratios in order to reduce driver fatigue while improving the feel and responsiveness of the vehicle. For example, at very low speeds, such as that which might be experienced in a parking situation, a relatively small rotation of the hand-wheel may be supplemented using an active steering system in order to provide an increased steering angle to the steerable road wheels.

An active rear steering (ARS) system utilizes a three phase brushless DC motor to position rear wheels of a vehicle. When the active rear steering system is not activated, it is desirable to short three phase windings of the DC motor together by closing a pair of electrical contacts to generate a braking force to prevent movement of the rear wheels by the DC motor. If the pair of electrical contacts does not have a closed operational position when the active rear steering system is not activated, the braking force is not generated.

Alternately, when the active rear steering system is activated, it is desirable to open the pair of electrical contacts to allow desired operation of the DC motor. It is further desired that the electrical conductivity of the two contacts of the motor shorting relay be verified. If the pair of electrical contacts does not have an open operational position when the active rear steering system is activated, the operation of the motor is degraded. In addition, partial failure of the relay cannot be detected.

There is a recognized need for a system and a method for detecting a motor shorting relay failure.

SUMMARY

Disclosed herein is a method for determining a motor shorting relay failure in a motor, the motor having first phase winding in a first leg of the motor, a second phase winding in a second leg of the motor, and a third phase winding in a third leg of the motor, the method including applying a first voltage signal to the first leg, applying a second voltage signal to the second leg, applying a test voltage to a test circuit electrically coupled to the third leg, measuring a third voltage signal in the third leg at a first predetermined time in response to the application of the first and second voltage signals and determining a motor shorting relay in the motor, based on the amplitude of the third voltage signal.

Further disclosed herein is a system for determining a motor shorting relay failure in a motor, the motor having first phase winding in a first leg of the motor, a second phase winding in a second leg of the motor, and a third phase winding in a third leg of the motor, the system including a motor circuit having three legs, each of the legs having a drive circuit transistor arrangement, each arrangement being electrically coupled to a respective phase winding, a test circuit electrically coupled to each of the drive circuit test arrangements and a voltage measurement node electrically coupled to each of the drive circuit transistor arrangements, a processor electrically coupled to the motor circuit, the processor configured to induce the motor circuit to apply a first voltage signal to the first leg and a second voltage signal to the second leg, to induce the test circuit in the third leg to induce a test voltage to the third leg, and to measure a response voltage from the third leg.

Further disclosed herein is a computer-readable medium having computer-executable instructions for performing a method including applying a gate voltage signal to a transistor in a first leg of a drive circuit electrically coupled to a motor circuit, applying a gate voltage signal to a transistor in a second leg of the drive circuit, applying a test voltage to a test circuit electrically coupled to a third leg of the drive circuit, measuring a response voltage from the third leg and determining the presence of a motor shorting relay failure in the motor circuit in response to the response voltage.

The above-described and other features will be appreciated and understood by those skilled in the art from the following detailed description, drawings, and appended claims.

BRIEF DESCRIPTION OF THE DRAWINGS

The embodiments will now be described, by way of an example, with references to the accompanying drawings, wherein like elements are numbered alike in the several figures in which.

DETAILED DESCRIPTION OF EXEMPLARY EMBODIMENTS

Figure 1:
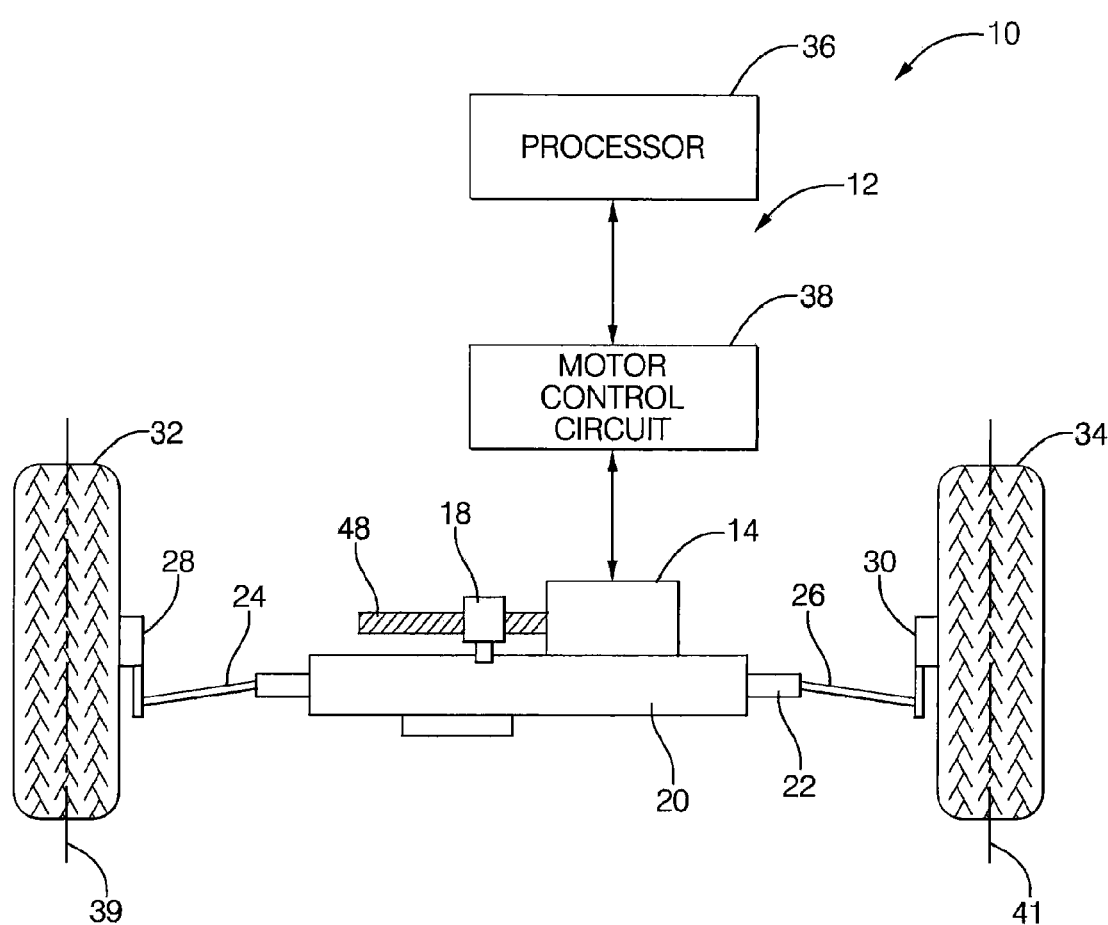
FIG. 1 is a block diagram of an active rear steering system of a vehicle having a processor, a motor control circuit, and a motor.

Referring to FIG. 1, a vehicle 10 having an active rear steering system 12 is illustrated. The active rear steering system 12 has an active operational state where the system 10 is utilized to move the rear vehicle wheels 32, 34 to desired rotational positions. Further, the active rear steering system 12 has an inactive operational state where the system 10 does not move the rear vehicle wheels 32, 34. The active rear steering system 12 includes a motor 14, a drive mechanism 18, a steering rack 20, a rack shaft 22, tie rods 24, 26, knuckle arms 28, 30, rear vehicle wheels 32, 34, a processor 36, and a motor control circuit 38.

Figure 2:
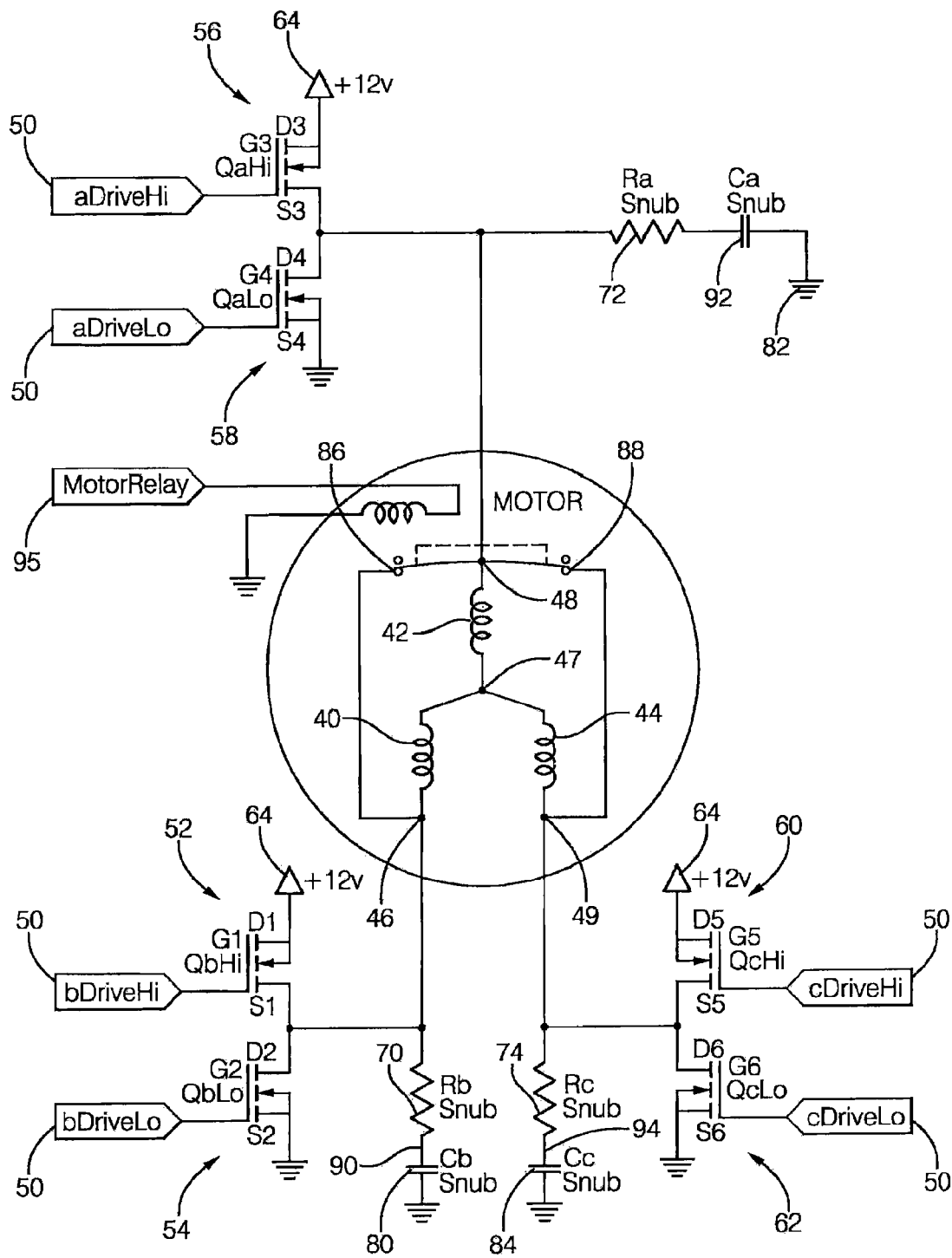
FIG. 2 is an electrical schematic of the active rear steering system of FIG. 1.

The motor 14 is provided to drive the drive mechanism 18 for moving the vehicle wheels 32, 34 to predetermined positions. Referring also now to FIG. 2, which is an electrical schematic of the active rear steering system of FIG. 1, the motor 14 includes phase windings 40, 42, 44, electrical nodes 46, 47, 48, 49 and the rotor 45. The phase winding 40 is electrically coupled between the node 446 and the node 47. The phase winding 42 is electrically coupled between the node 48 and the node 47. Further, the phase winding 44 is electrically coupled between the node 49 and the node 47. The phase windings 40, 42, 44 can be energized via the motor control circuit 38 to induce the rotor shaft 45 to rotate in either a first direction or a second direction opposite the first direction. The drive mechanism 18 converts the rotational motion of the rotor shaft 45 to a linear motion of the steering rack 20 and the rack shaft 22. The rack shaft 22 is operably coupled to the tie rods 24, 26 that are further operably coupled to the knuckle arms 28, 30, respectively. Further, the knuckle arms 24, 26 are operably coupled to the rear vehicle wheels 32, 34 respectively. When the motor shaft 45 rotates in a first rotational direction, the rack shaft 22 is moved in a first linear direction. In response, the tie rods 24, 26 and the knuckle arms 28, 30 induce the vehicle wheels 32, 34, respectively, to rotate in a first predetermined direction about steering axes 39, 41, respectively, associated with the vehicle wheels 32, 34, respectively, toward a desired rear vehicle wheel steering angle. Alternately, when the motor shaft 45 rotates in a second rotational direction, the rack shaft 22 is moved in a second linear direction, opposite the first linear direction. In response, the tie rods 24, 26 and the knuckle arms 28, 30 induce the vehicle wheels 32, 34, respectively, to rotate in a second predetermined direction about steering axes 39, 41 respectively, associated with the vehicle wheels 32, 34, respectively, toward a desired rear vehicle wheel steering angle.

When the active rear steering system 12 is in an inactive operational state, the electrical contacts 86, 88 are provided to have closed operational states, triggered by motor relay 95. When the electrical contacts 86, 88 have the closed operational state, the motor 14 is prevented from rotating the rotor shaft 45 in response to voltage signals from the transistors. When the active rear steering system 12 is in an active operational state, the electrical contacts 86, 88 are provided to have open operational states, triggered by motor relay 95, to allow the motor 14 to rotate the rotor shaft 45 in response to voltage signals from the transistors.

The processor 36 is provided to generate command signals that induce the motor control circuit 38 to generate voltage signals that are applied to the phase windings 40, 42, 44 to induce rotation of the rotor 45. Further, the processor 36 is provided to generate command signals that induce the motor control circuit 38 to generate voltage signals that are applied to the phase windings 40, 42 for determining operational states of the electrical contacts 86, 88. The processor 36 is electrically coupled to the gate drive 50 and to the nodes 46, 48, 49 of the motor 14. Processor 36 also controls motor relay 95 and can process algorithms to detect motor and motor relay shorts as well as shorting relay failures.

The motor control circuit 38 is provided to generate voltage signals that are applied to the phase windings 40, 42, 44 in response to command signals received from the processor 36. The motor control circuit 38 includes a gate drive 50, transistors 52, 54, 56, 58, 60, 62, a voltage source 64, resistors 70, 72, 74 and capacitors 80, 82, 84.

The gate drive 50 is provided to control operation of the transistors 52, 54, 56, 58, 60 and 62 in response to command signals received from the processor 36. The gate drive 50 is electrically coupled to gates of the transistors 52, 54, 56, 58, 60 and 62.

The transistors 52, 54, 56, 58, 60, 62 are provided to supply voltage signals to the phase windings 40, 42, 44 of the motor 14. The transistor 52 has a gate terminal (G1) electrically coupled to the gate drive 50 (bDriveHi), a drain terminal (D1) electrically coupled to the voltage source 64, and a source terminal (S1) electrically coupled to both a drain terminal (D2) of the transistor 54 and the node 46. The transistor 54 has a gate terminal (G2) electrically coupled to the gate drive 50 (bDriveLo), a drain terminal (D2) electrically coupled to both a source terminal (S1) of the transistor 52 and the node 46, and a source terminal (S2) electrically coupled to electrical ground. A series combination of the resistor 70 and the capacitor 80 are electrically coupled between the node 46 and electrical ground. The transistor 56 has a gate terminal (G3) electrically coupled to the gate drive 50 (aDriveHi), a drain terminal (D3) electrically coupled to the voltage source 64, and a source terminal (S3) electrically coupled to both a drain terminal (D4) of transistor 58 and the node 48. The transistor 58 has a gate terminal (G4) electrically coupled to the gate drive 50 (aDriveLo), a drain terminal (D4) electrically coupled to both a source terminal (S3) of the transistor 56 and the node 48, and a source terminal (S4) electrically coupled to electrical ground. A series combination of the resistor 72 and the capacitor 82 are electrically coupled between the node 48 and electrical ground. The transistor 60 has a gate terminal (G5) electrically coupled to the gate drive 50 (cDriveHi), a drain terminal (D5) electrically coupled to the voltage source 64, and a source terminal (S5) electrically coupled to both a drain terminal (D6) of the transistor 62 and the node 49. The transistor 62 has a gate terminal (G6) electrically coupled to the gate drive 50 (cDriveLo), a drain terminal (D6) electrically coupled to both a source terminal (S5) of the transistor 60 and the node 49, and a source terminal (S6) electrically coupled to electrical ground. A series combination of the resistor 74 and capacitor 84 is electrically coupled between the node 49 and electrical ground. In general, transistor pairs 52 and 54, 56 and 58, and 60 and 62 can all be considered a "leg" of the motor and drive circuit as described.

Figure 3:
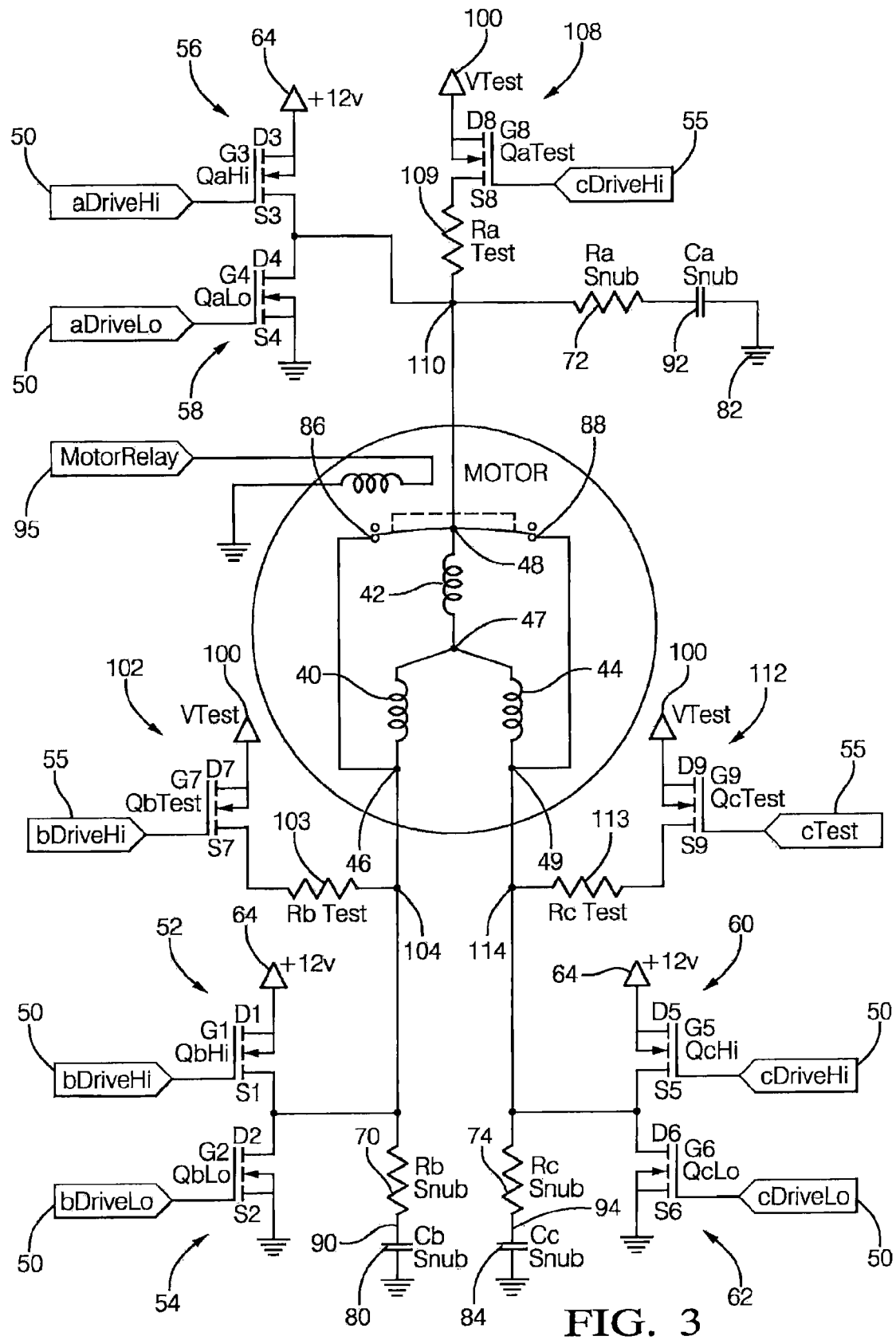
FIG. 3 is an electrical schematic of the active rear steering system of FIG. 2 with the inclusion of test circuits.

FIG. 3 is an electrical schematic of the active rear steering system of FIG. 2 with the inclusion of test circuits. Each leg a, b, c of the motor and drive circuit described above is provided with a test circuit, on each of the respective legs a, b, c. The test circuits include transistors 102, 108, 112 that are used to provide voltage signals to the respective test circuit as described further below. The transistor 102 has a gate terminal (G7) electrically coupled to the gate test drive 55 (bTest), a drain terminal (D7) electrically coupled to the test voltage source 100, and a source terminal (S7) electrically coupled in series to test resistor 103 that is coupled to node 104 electrically coupled between node 46 and resistor 70. The transistor 108 has a gate terminal (G8) electrically coupled to the gate test drive 55 (aTest), a drain terminal (D8) electrically coupled to the test voltage source 100, and a source terminal (S8) electrically coupled in series to test resistor 109 that is coupled to node 110 electrically coupled between node 48 and resistor 72. The transistor 112 has a gate terminal (G9) electrically coupled to the gate test drive 55 (cTest), a drain terminal (D9) electrically coupled to the test voltage source 100, and a source terminal (S9) electrically coupled in series to test resistor 113 that is coupled to node 114 electrically coupled between node 49 and resistor 74. The test circuits further include voltage test points 120, coupled to respective nodes 104, 110, 114, which are the motor connection of the legs a, b, c. The test points 120 are further coupled between source (S1) of transistor 52 and drain (D2) of transistor 54, source (S3) of transistor 56 and drain (D4) of transistor 58, and source (S5) of transistor 60 and drain (D6) of transistor 60.

Figure 4:
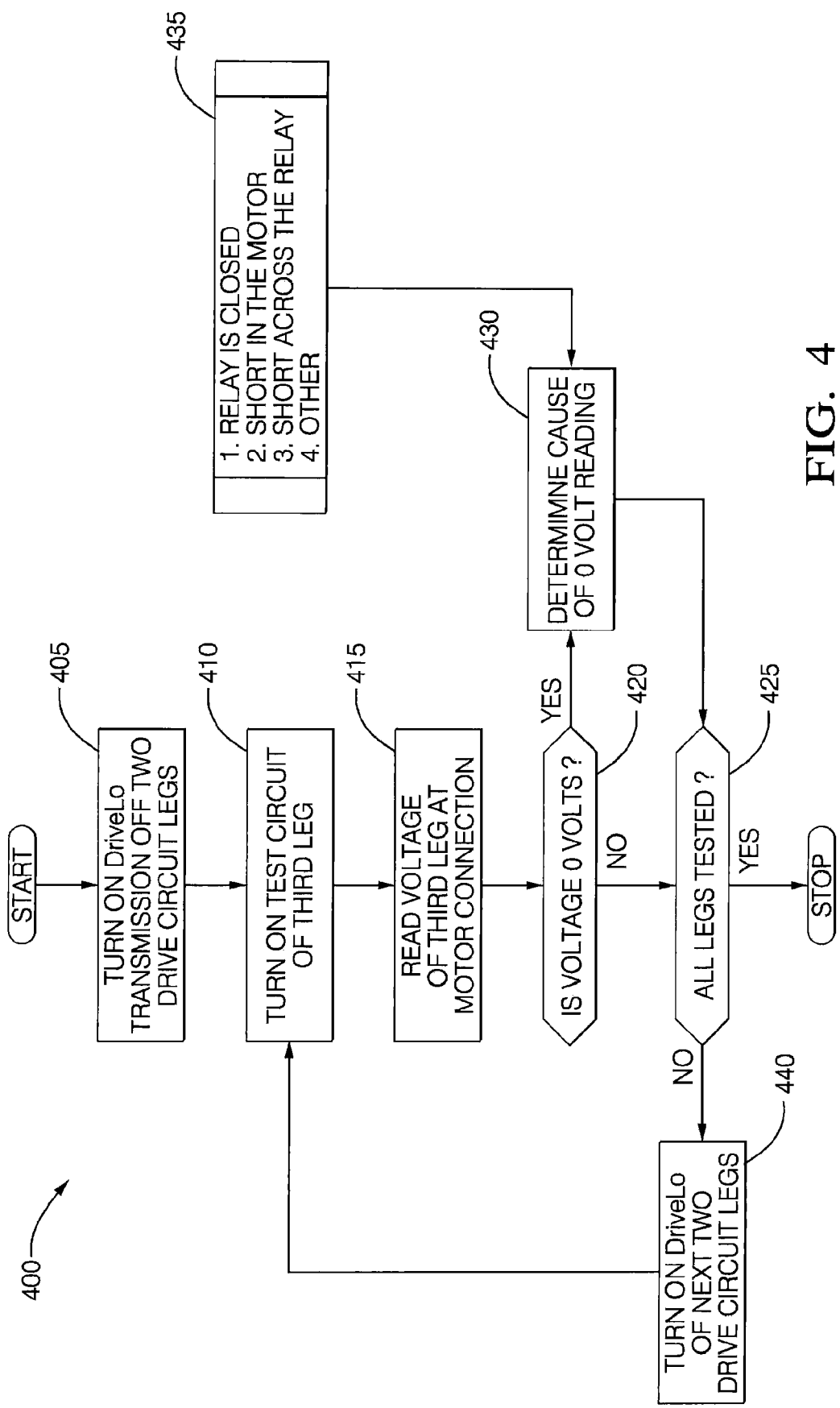
FIG. 4 illustrates an exemplary methodology for the detection of a motor shorting relay failure.

It is appreciated that the addition of the test circuit to the ARS system as described above allows for detection of a motor shorting relay failure. Software algorithms can be implemented to provide detection as described. The detection methodology is now described with respect to FIG. 4, which illustrates an exemplary methodology for the detection of a motor shorting relay failure.

In general, prior to operating the ARS system, the motor and relay circuit are checked by turning on two of the DriveLo FETs transistors 50, that is any two of aDriveLo, bDriveLo, cDriveLo, at step 405. In addition, at step 410, the drive circuit of the third leg, that is any one of aTest, bTest, cTest, is also turned on. At step 415, the voltage at the test leg is then read at $V_{aOut}$, $V_{bOut}$, $V_{cOut}$.

At step 420, it is determined whether or not the voltage reading of the third leg is 0 volts. If the voltage reading is immediately 0 volts at step 420, then the cause of the 0 volt reading is determined at step 425. In general, if the reading is 0 volts at step 420, the reason determined at step 425 can include, but is not limited to: the relay is closed; there is a short in the motor; there is a short across the relay, etc. These reasons can be predetermined at step 430.

If the voltage reading is not immediately 0 volts, and the voltage has not decayed, then the circuit is open. Then, at step 420, then it is determined whether or not all of the test leg pairs have been tested at step 435. If all of the test leg pairs have not been tested at step 435, then the motor and relay circuit are checked by turning on the next two of the DriveLo FETs transistors 50, that is any two of aDriveLo, bDriveLo, cDriveLo, at step 440. In addition, at step 410, the drive circuit of the third leg, that is any one of aTest, bTest, cTest, is also turned on. The process is then repeated until all of the test leg pairs have been tested and reasons for a 0 volt reading have been determined. It is appreciated that testing each leg of the circuit is performed to verify each winding and relay contact. For example, an open circuit on Lc can be verified by enabling aDriveLo, bDriveLo and aTest, and checking for signal decay at VaOut. A short between Lb and Lc is verified by a normal operation with bDriveLo, cDriveLo and aTest enabled, and an immediate reading of 0 volts at Vcout with aDriveLo, bDriveLo and cTest enabled.

It is further appreciated that time delays, as waiting periods, can be added to the algorithm as discussed above, in order to test for decays. For example, in a circuit with $R_{aTest}=10\Omega$ and $V_{test}=12V$, the algorithm is:

---
Enable cDriveLo and bDriveLo
Enable cTest
Wait 0.1μs
Read $V_{aout}$
If Vaout>5V then no short in leg a
Wait 30μs
If Vaout<5V then no open leg a

---

Figure 5:
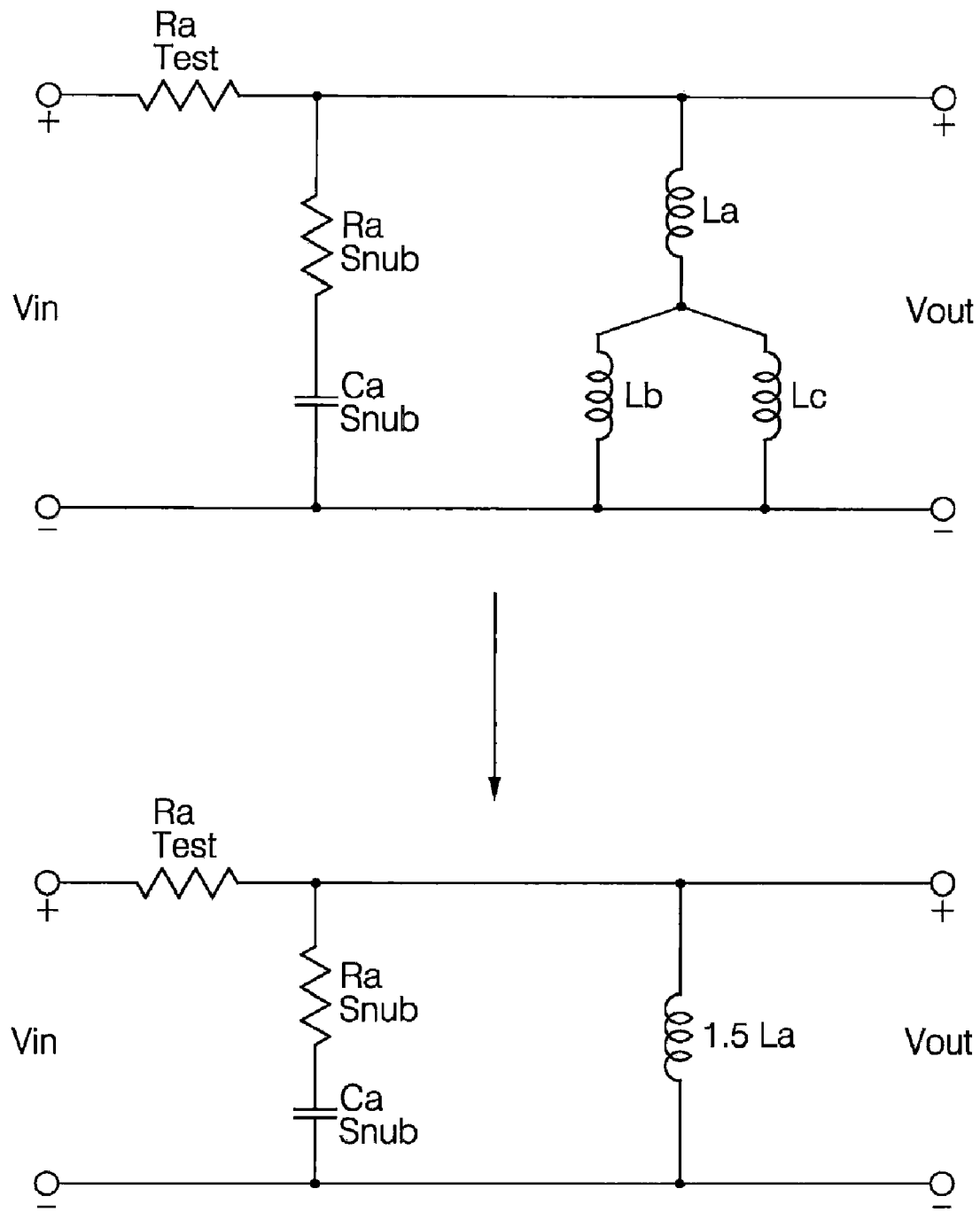
FIG. 5 illustrates an equivalent circuit of two drive legs and a test leg.

To further illustrate the aforementioned example, FIG. 5 illustrates the equivalent circuit of cDriveLo and bDriveLo are on with $V_{in}$ at the node between the test transistor (FET) and the test resistor of the motor phase a. The values of $R_{aSnub}$ and $C_{aSnub}$ are given in order to provide the snub circuit. Analyzing each of the paths individually for illustrative purposes, the time constant for the inductor path is $R_{aTest}/(1.5*La)$, and the time constant for the capacitor circuit is $1/(R_{aTest}+R_{aSnub})*C_{aSnub}$. Therefore, $R_{aTest}$ is chosen to balance the time constant of the inductor circuit, the time constant of the capacitor circuit, and the current drawn through the test FET. In an exemplary implementation, a slow time constant is selected for the inductor circuit, a fast time constant is selected for the capacitor circuit, and a low current is drawn for a small test FET.

Figure 6:
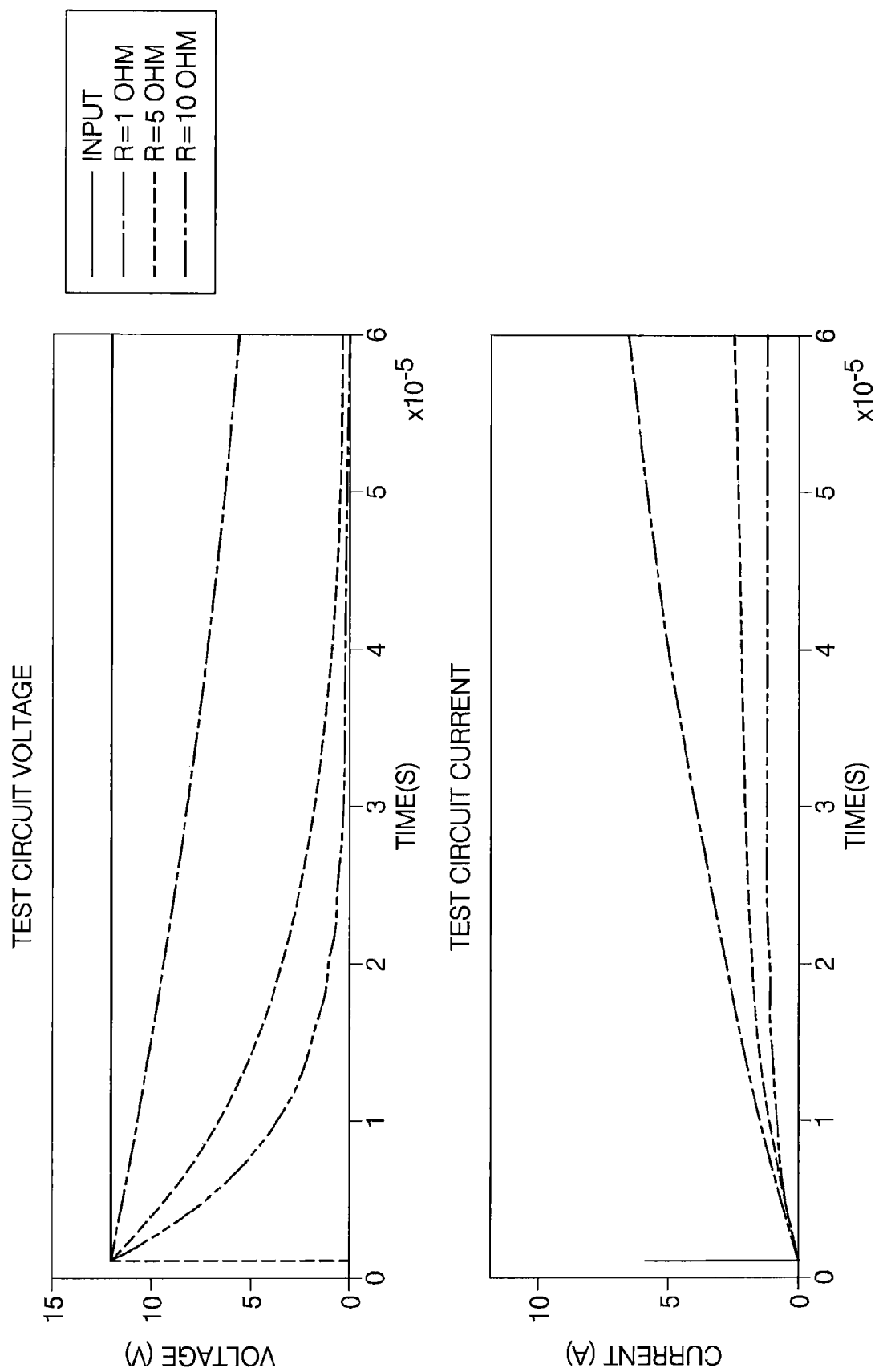
FIGS. 6 and 7 illustrate exemplary voltage and current responses for various values of the test resistor with a $V_{test}$.
Figure 7:
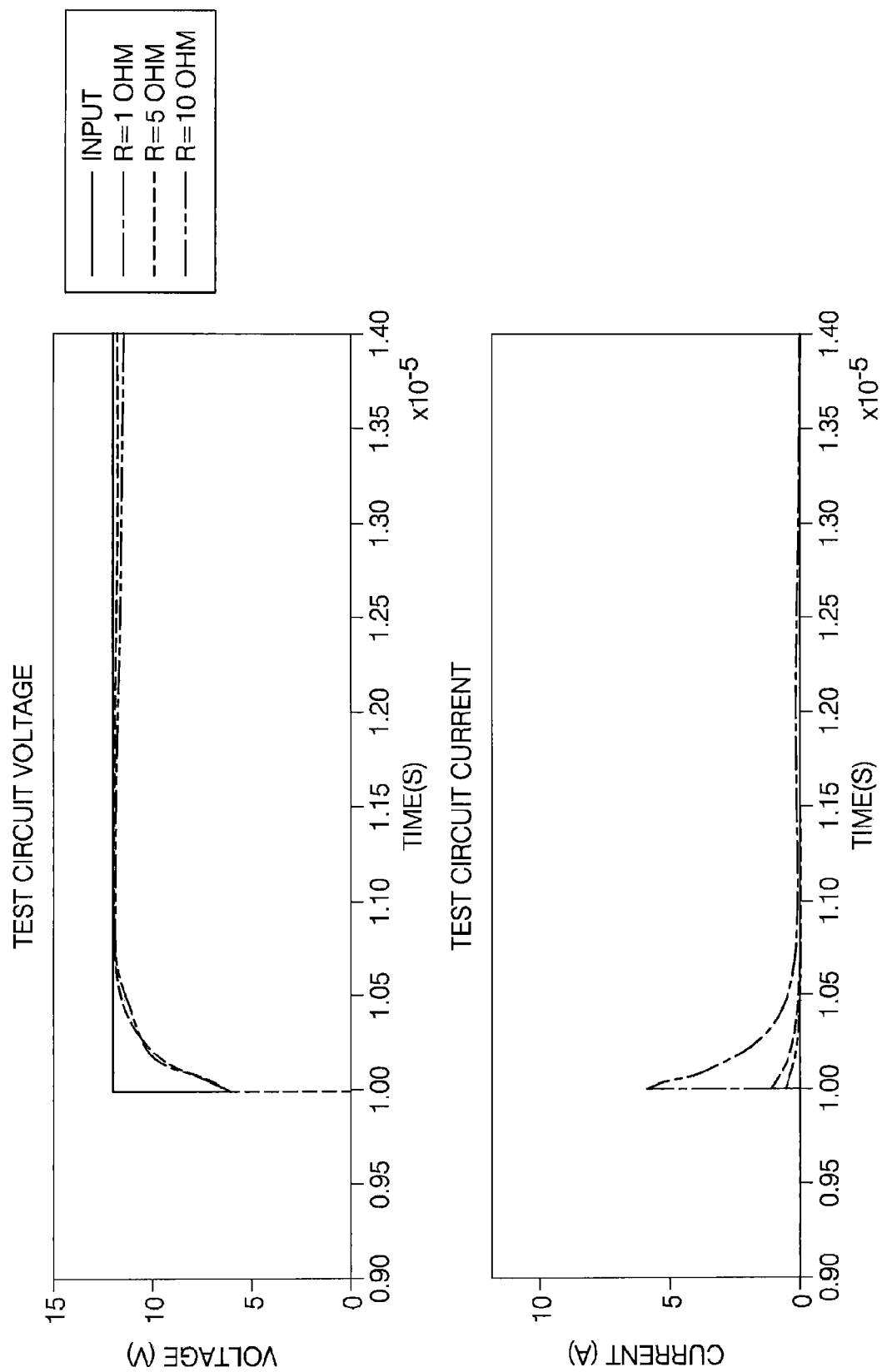

FIGS. 6 and 7 illustrate exemplary voltage and current responses for various values of the test resistor with a $V_{test}$ of 12V. In general, FIGS. 6 and 7 illustrate that decreasing $R_{aTest}$ increases the fall time for the output, but increases current draw.

Figure 8:
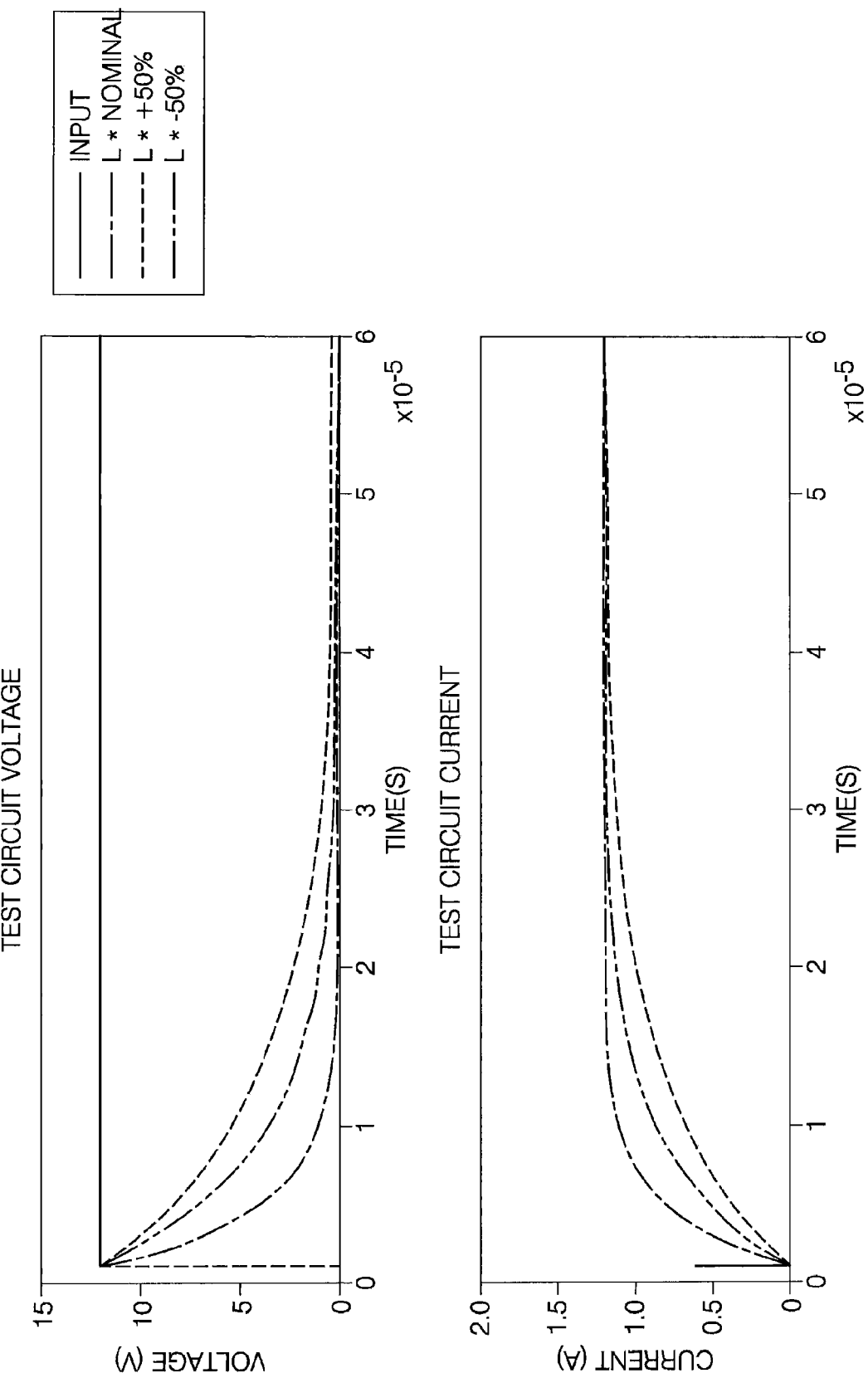
FIG. 8 illustrates an exemplary output voltage and current response for a variation of $L_a$.

It is appreciated that the previously described circuits can be simplified as shown by the equivalent circuit in FIG. 5, and the diagnostic is robust to variations in the inductance of the motor windings. FIG. 8 illustrates an output voltage and current response for a 50% variation of $L_a$, and $R_{test}=10\Omega$. As illustrated, it is appreciated that there is sufficient time to check the voltage before it decays.

As described above, the present invention for the detection of a motor shorting relay failure can be embodied in the form of computer-implemented processes and apparatuses for practicing those processes. The present invention can also be embodied in the form of computer program code containing instructions embodied in tangible media, such as floppy diskettes, CD ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to an exemplary embodiment, it will be understood by those skilled in the art that various changes may be made and equivalents may be substituted for elements thereof without departing from the scope of the invention. Terms such as "first" and "second" are used herein merely to distinguish between two like elements, and are not intended to imply an order such as of importance or location. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for determining a motor shorting relay failure in a motor, the motor having first phase winding in a first leg of the motor, a second phase winding in a second leg of the motor, and a third phase winding in a third leg of the motor, the method comprising:

applying a first voltage signal to the first leg;
applying a second voltage signal to the second leg;
applying a test voltage to a test circuit electrically coupled to the third leg;

measuring a third voltage signal in the third leg at a first predetermined time in response to the application of the first and second voltage signals; and determining a motor shorting relay failure in the motor, based on the amplitude of the third voltage signal.

2. The method as claimed in claim 1 further comprising measuring the third voltage signal at a second predetermined time.

3. The method as claimed in claim 2 further comprising determining that there is no short in a motor relay in response to the third signal being above a voltage threshold.

4. The method as claimed in claim 3 further comprising determining that there is no open leg in response to the third voltage signal below the voltage threshold.

5. The method as claimed in claim 1 wherein determining the motor shorting relay failure in the motor comprises determining a decay of the third voltage signal.

6. The method as claimed in claim 5 wherein the decay of the third voltage signal to 0 volts determines a motor condition.

7. The method as claimed in claim 6 wherein the motor condition comprises as least one of: a motor relay in a closed condition; a short in the motor; and a short across a relay in the motor.

8. The method as claimed in claim 1 wherein the first voltage signal is applied to a gate of a transistor in the first leg.

9. The method as claimed in claim 8 wherein the second voltage signal is applied to a gate of a transistor in the second leg.

10. The method as claimed in claim 9 further comprising:
removing the first voltage from the first leg;
applying the first voltage signal to the second leg;
applying the second voltage signal to the third leg;
applying a test voltage to a test circuit electrically coupled to the first leg;
measuring a fourth voltage signal in the first leg at a first predetermined time in response to the application of the first and second voltage signals; and
determining a motor shorting relay failure in the motor, based on the amplitude of the fourth voltage signal.

11. The method as claimed in claim 10 further comprising:
removing the first voltage from the second leg;
applying the first voltage signal to the first leg;
applying the second voltage signal to the third leg;
applying a test voltage to a test circuit electrically coupled to the second leg;
measuring a fifth voltage signal in the second leg at a first predetermined time in response to the application of the first and second voltage signals; and
determining a motor shorting relay failure in the motor, based on the amplitude of the fifth voltage signal.

12. A system for determining a motor shorting relay failure in a motor, the motor having first phase winding in a first leg of the motor, a second phase winding in a second leg of the motor, and a third phase winding in a third leg of the motor, the system comprising:
a motor circuit having three legs, each of the legs having a drive circuit transistor arrangement, each arrangement being electrically coupled to a respective phase winding;
a test circuit electrically coupled to each of the drive circuit test arrangements; and
a voltage measurement node electrically coupled to each of the drive circuit transistor arrangements,
a processor electrically coupled to the motor circuit, the processor configured to induce the motor circuit to apply a first voltage signal to the first leg and a second voltage signal to the second leg, to induce the test circuit in the third leg to induce a test voltage to the third leg, and to measure a response voltage from the third leg.

13. The system as claimed in claim 12 wherein the processor is further configured to determine a decay of the response voltage.

14. The system as claimed in claim 13 wherein the processor is further configured to determine a reason for the decay of the response voltage to 0 volts.

15. The system as claimed in claim 14 wherein the reason for the decay of the response voltage to 0 volts is a predetermined condition of a motor relay that controls the operational states of electrical contacts in the motor circuit.

16. The system as claimed in claim 15 wherein the predetermined condition includes at least one of: the motor relay in a closed condition; a short in the motor; and a short across the motor relay in the motor.

17. A computer-readable medium having computer-executable instructions for performing a method comprising:
applying a gate voltage signal to a transistor in a first leg of a drive circuit electrically coupled to a motor circuit;
applying a gate voltage signal to a transistor in a second leg of the drive circuit;
applying a test voltage to a test circuit electrically coupled to a third leg of the drive circuit;
measuring a response voltage from the third leg; and
determining the presence of a motor shorting relay failure in the motor circuit in response to the response voltage.

* * * * *